United States Patent
Feng

(10) Patent No.: US 8,372,687 B2
(45) Date of Patent: Feb. 12, 2013

(54) SYSTEM, METHOD AND APPARATUS FOR FORMING MULTIPLE LAYERS IN A SINGLE PROCESS CHAMBER

(75) Inventor: Aiguo Feng, Fremont, CA (US)

(73) Assignee: Ahbee1, LP, San Jose, CA (US)

( * ) Notice: Subject to any disclaimer, the term of this patent is extended or adjusted under 35 U.S.C. 154(b) by 0 days.

(21) Appl. No.: 12/932,114

(22) Filed: Feb. 16, 2011

(65) Prior Publication Data

US 2012/0208314 A1 Aug. 16, 2012

(51) Int. Cl.
*H01L 21/06* (2006.01)
*H01L 21/00* (2006.01)
*H01L 21/36* (2006.01)
*H01L 29/08* (2006.01)

(52) U.S. Cl. .......... 438/102; 438/98; 438/503; 438/509; 257/42; 257/E21.068

(58) Field of Classification Search .................... 438/98, 438/102, 503, 507, 509; 257/42, E31.008, 257/E29.087, E21.068
See application file for complete search history.

(56) References Cited

U.S. PATENT DOCUMENTS

| 3,667,424 | A | 6/1972 | Cornelius |
| 6,368,892 | B1 | 4/2002 | Arya |
| 2002/0014441 | A1 | 2/2002 | Yoshida |
| 2004/0132315 | A1 | 7/2004 | Chambers et al. |
| 2005/0186342 | A1* | 8/2005 | Sager et al. ................. 427/248.1 |
| 2006/0211224 | A1* | 9/2006 | Matsuda ........................ 438/493 |
| 2008/0178925 | A1* | 7/2008 | Wu et al. ........................ 136/244 |
| 2008/0276451 | A1* | 11/2008 | Morad ............................. 29/742 |
| 2009/0050208 | A1* | 2/2009 | Basol et al. .................... 136/264 |
| 2009/0263578 | A1* | 10/2009 | Lindfors et al. ........... 427/248.1 |
| 2010/0186812 | A1 | 7/2010 | Eaglesham |
| 2011/0023933 | A1 | 2/2011 | Bartholomeusz |
| 2011/0030794 | A1* | 2/2011 | Teng ............................. 136/262 |

OTHER PUBLICATIONS

PCT International Search Report—PCT/US2012/25402—dated Aug. 17, 2012 (11 pages).

\* cited by examiner

*Primary Examiner* — Kevin Parendo

(57) ABSTRACT

A method for forming multiple layers in a single process chamber includes placing a substrate in the process chamber having multiple processing sources and iteratively forming a copper indium gallium selenium (CIGS) including forming multiple relatively thin CIGS layers including forming a copper indium gallium (CIG) layer on the substrate, the CIG layer having a thickness of between less than about 50 angstroms and about 200 angstroms, forming a selenium layer on the CIG layer, the selenium layer having a thickness of between less than about 50 angstroms and about 200 angstroms and heating the substrate, the CIG layer and the selenium layer. A processing chamber system is also disclosed.

20 Claims, 11 Drawing Sheets

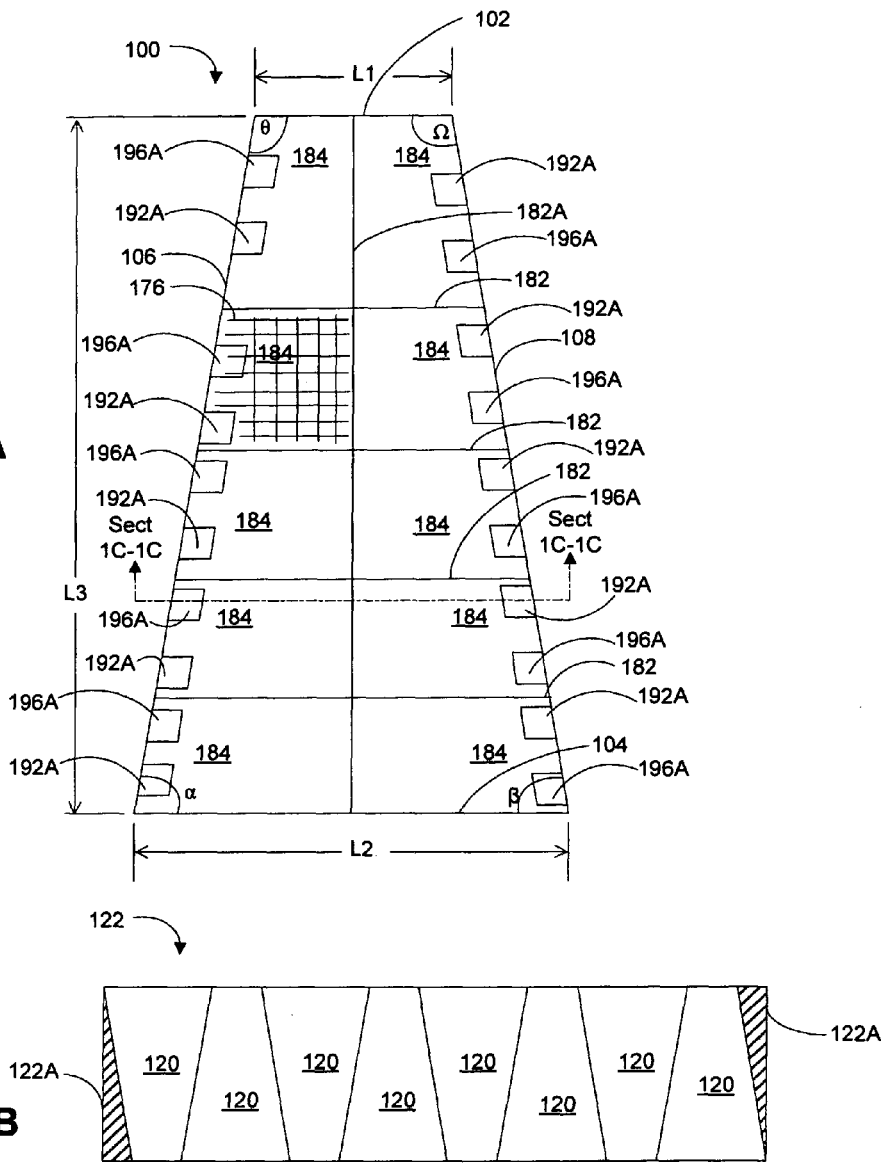
FIG. 1A
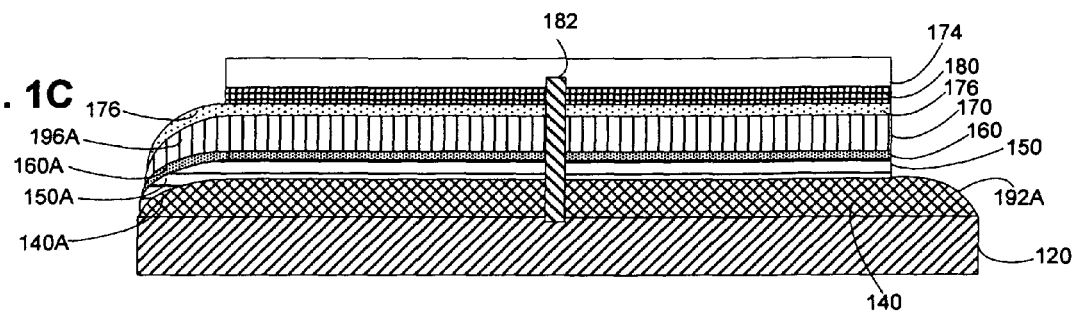
FIG. 1B
FIG. 1C

FIG. 1-i

SYSTEM, METHOD AND APPARATUS FOR FORMING MULTIPLE LAYERS IN A SINGLE PROCESS CHAMBER

BACKGROUND

The present invention relates generally to solar cell manufacturing, and more particularly, to methods and systems for single chamber photovoltaic solar cell manufacturing systems, methods and apparatus.

Typical photovoltaic solar cell (solar cell) manufacturing is very complex and requires several different processing steps and processing tools, in series, to form a solar cell. This complex process and equipment reduces the solar cell production throughput while also increasing solar cell costs.

In view of the foregoing, there is a need for a simplified system, method and apparatus for solar cell manufacturing.

SUMMARY

Broadly speaking, the present invention fills these needs by providing a simplified system, method and apparatus for solar cell manufacturing. It should be appreciated that the present invention can be implemented in numerous ways, including as a process, an apparatus, a system, computer readable media, or a device. Several inventive embodiments of the present invention are described below.

One embodiment provides a method for forming multiple layers in a single process chamber includes placing a substrate in the process chamber having multiple processing sources and iteratively forming a copper indium gallium selenium (CIGS) including forming multiple relatively thin CIGS layers including forming a copper indium gallium (CIG) layer on the substrate, the CIG layer having a thickness of between less than about 50 angstroms and about 200 angstroms, forming a selenium layer on the CIG layer, the selenium layer having a thickness of between less than about 50 angstroms and about 200 angstroms and heating the substrate, the CIG layer and the selenium layer.

The relatively thin CIGS layers can include between about 100 and about 500 relatively thin CIGS layers. Placing the substrate in the process chamber includes forming a conductive layer on the substrate. The conductive layer is formed in a continuously falling pressure gradient. The continuously falling pressure gradient occurs over a time period of between about 5 minutes and about 20 minutes.

The continuously falling pressure gradient can begin at an initial pressure of about 60 mtorr and includes a final pressure of about 7 mtorr. The continuously falling pressure gradient can include a substantially constant slope gradient. The continuously falling pressure gradient can include a substantially progressive slope curve. The continuously falling pressure gradient can be a substantially regressive slope curve. The conductive layer can include molybdenum.

The method can also include forming multiple bottom layer contacts, wherein placing the substrate in the process chamber includes placing the substrate in a first holder, wherein the first holder includes a first set of contact fingers, the first set of contact fingers contacting the substrate in locations other than the multiple bottom layer contact locations and wherein forming the conductive layer on the substrate includes forming the conductive layer in the bottom layer contact locations.

The method can also include forming multiple top layer contacts including covering the bottom layer contacts and not covering multiple top layer contact locations with a second holder having a second set of contact fingers. The second set of contact fingers covering the bottom layer contacts and not covering the top layer contact locations and wherein forming the CIGS layer includes forming the CIGS layer in the top layer contact locations.

The method can also include forming a buffer layer on the CIGS layer, forming a transparent conductive layer on the buffer layer, forming a conductive grid over the transparent conductive layer, the conductive grid extending over the top layer contacts and forming multiple scribe lines to divide the substrate into multiple smaller cells. The multiple smaller cells each have a substantially equal area.

The substrate can have a trapezoidal shape. At least one of the processing sources can have a shape substantially similar to a shape of the substrate. Placing the substrate in the process chamber can include separating the substrate from a substantially rectangular substrate blank. Heating the substrate, the CIG layer and the selenium layer includes heating the substrate, the CIG layer and the selenium layer from an initial temperature of about 250 degrees C. to a final temperature of between about 450 degrees C. and about 550 degrees C.

Heating the substrate, the CIG layer and the selenium layer can include heating the substrate, the CIG layer and the selenium layer from an initial temperature of about 250 degrees C. to a final temperature of between about 450 degrees C. and about 550 degrees C., wherein the temperature of the substrate, the CIG layer and the selenium layer increases each iteration of forming each of the relatively thin CIGS layers.

The single process chamber can include a rotary support and wherein iteratively forming a copper indium gallium selenium (CIGS) includes rotating the substrate over the processing sources. Rotating the substrate over the processing sources includes rotating the substrate over the processing sources at a revolution rate of between about 0.1 and about 100 revolutions per minute.

Forming the CIG layer on the substrate can includes forming a plasma in at least one of the processing sources. Forming the selenium layer on the CIG layer can include evaporating a quantity of selenium in at least one of the processing sources.

Heating the substrate, the CIG layer and the selenium layer can include applying heat from at least one of the processing sources.

Another embodiment provides a process chamber system including multiple processing sources and a substrate support and transport system capable of moving a substrate contained therein over the processing sources. The substrate support system including a first holder including a first set of contact fingers, the first set of contact fingers contacting the substrate in locations other than a set of bottom layer contact locations and a second holder having a second set of contact fingers, the second set of contact fingers covering the bottom layer contacts and not covering the top layer contact locations.

The substrate support and transport system can include a rotary support. The substrate support and transport system can be coupled to a motor. The system can also include a controller coupled to the system, the controller including operating system, software, logic and a recipe for controlling the operations in the process chamber system.

At least one of the processing sources can include an evaporator, the evaporator including an evaporator tray, a evaporator cover having a plurality of holes and a heat source thermally coupled to the evaporator tray. At least one of the processing sources can include a plasma source, the plasma source including at least one ring plasma source. The processing chamber can have a width of between about 200 mm and about 1000 mm. The substrate support and transport system is capable of supporting and transporting a substrate having a largest dimension of between about 100 mm and about 900 mm.

Another embodiment provides a method for forming multiple layers in a single process chamber including placing a substrate in the process chamber having multiple processing sources forming multiple bottom layer contacts, forming a conductive layer on the substrate, forming a set of top layer contacts, iteratively forming a copper indium gallium selenium (CIGS) layer including forming multiple relatively thin CIGS layers, wherein the relatively thin CIGS layers includes between about 100 and about 500 relatively thin CIGS layers including rotating the substrate over the processing sources, forming a copper indium gallium (CIG) layer on the substrate, the CIG layer having a thickness of between less than about 50 angstroms and about 200 angstroms, forming a selenium layer on the CIG layer, the selenium layer having a thickness of between less than about 50 angstroms and about 200 angstroms, wherein forming the selenium layer includes evaporating a quantity of selenium in one of the processing sources and heating the substrate, the CIG layer and the selenium layer, forming a buffer layer on the CIGS layer, forming a transparent conductive layer on the buffer layer; and forming a conductive grid over the transparent conductive layer, the conductive grid extending over the of top layer contacts.

Another embodiment includes a rotary process chamber system including multiple processing sources and a rotary substrate support and transport system capable of moving a set of substrates contained therein over the processing sources, the substrate support system including a first holder including a first set of contact fingers, the first set of contact fingers contacting the substrate in locations other than the bottom layer contact locations and a second holder having a second set of contact fingers, the second set of contact fingers covering the bottom layer contacts and not covering a set of top layer contact locations, a motor is also coupled to the rotary substrate support. A controller is also coupled to the rotary process chamber system, the controller including operating system, software, logic and a recipe for controlling a plurality of operations in the process chamber system.

Another embodiment provides a method for processing substrates having a largest dimension of between about 400 mm and about 900 mm comprising, placing a substrate on a rotary substrate support system in a process chamber having a width larger than the largest dimension of the substrate and rotating the substrate.

Another embodiment provides a rotary process chamber system includes a rotary substrate support and transport system capable of rotating a substrate having a largest dimension of between about 400 mm and about 900 mm, a motor coupled to the rotary substrate support, a controller coupled to the rotary process chamber system, the controller including operating system, software, logic and a recipe for controlling a set of operations in the process chamber system.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 1A is a top view of a solar cell, in accordance with an embodiment of the present invention.

FIG. 1B is a top layout view of multiple solar cell substrates, in accordance with an embodiment of the present invention.

FIG. 1C is a 1C-1C cross-sectional view of the solar cell, in accordance with an embodiment of the present invention.

FIGS. 1H-1M show a detailed view of the formation of the CIGS layer, in accordance with an embodiment of the present invention.

DETAILED DESCRIPTION

Figure 1D:
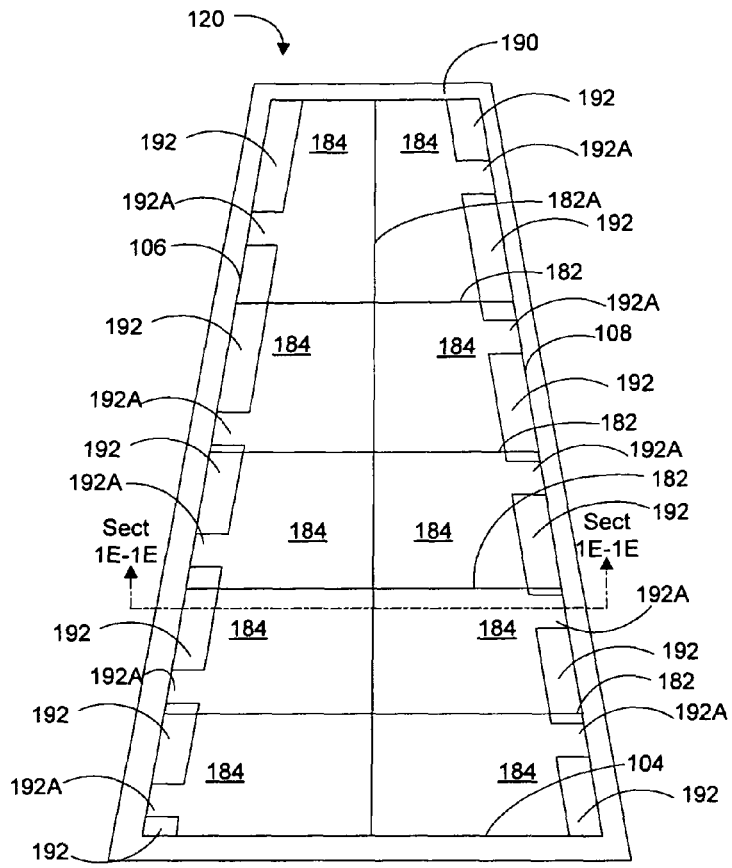
FIG. 1D is a simplified schematic diagram of the first holder, in accordance with an embodiment of the present invention.

Several exemplary embodiments for a simplified system, method and apparatus for solar cell manufacturing will now be described. It will be apparent to those skilled in the art that the present invention may be practiced without some or all of the specific details set forth herein.

A simplified system, method and apparatus for solar cell manufacturing will increase production throughput, reduce capital equipment costs and thus reduce solar cell production costs.

A solar cell (also called photovoltaic cell) is a solid state device that converts the energy of sunlight directly into electricity by the photovoltaic effect. The photovoltaic effect is where one or more photons of light energy impinge an atom of semiconductor material which causes the electrons to increase in energy level. The increased energy level of the electrons can be measured as a voltage potential across the P-N junction of the semiconductor material and a resulting electrical current can be produced.

FIG. 1A is a top view of a solar cell 100, in accordance with an embodiment of the present invention. The solar cell 100 has a substantially isosceles trapezoid shape. Specifically, the smaller end 102 and the larger end 104 are substantially parallel. The smaller end 102 can have a length L1 of between about 0 mm and about 50 mm or larger. The larger end 104 can have a length L2 of between about 50 mm and about 200 mm or larger. The solar cell 100 can have a length L3 of between about 100 and about 300 mm or larger.

Substantially straight, opposing sides 106, 108 form substantially equal and opposite respective angles α and β to the larger end 104 and substantially equal and opposite respective angles θ and Ω to the smaller end 102. The angles α, β, θ and Ω can be between about 20 and about 90 degrees.

The solar cell 100 is divided by scribe lines 182 into multiple smaller solar cells 184. Each of the smaller solar cells 184 has a substantially equal area. Each of the smaller solar cells 184 has a pair of electrical contacts 192A, 196A. The pair of electrical contacts includes a bottom layer 192A and a top layer contact 196A. The number of smaller solar cells 184 can be less or more than illustrated in this exemplary embodiment. The number of smaller solar cells 184 is determined by the desired output voltage of the solar cell 100.

Each of the smaller solar cells 184 has a conductive grid 176 connected to the respective top electrical contact 196A. The conductive grid 176 is only shown in one of the smaller solar cells 184 for clarity purposes but it should be understood that the conductive grid 176 is formed on each of the smaller solar cells 184. The conductive grid 176 does not cross the scribe lines 182 and is not electrically connected to the bottom electrode 192A. The width and pitch (i.e., separation) of the individual lines of the conductive grid 176 can be selected as a compromise between a desired conductivity and the area of the smaller solar cell 184 that is covered by the conductive grid. The conductive grid 176 can be formed by screen printing or any other acceptable process (e.g., mask and sputtering) to apply a conductive grid pattern. The conductive grid 176 can include silver, silver alloy, copper, copper alloy, aluminum, aluminum alloy or combinations thereof or any other suitable conductive material. By way of example, a conductive paste can be screen printed on the solar cell 100.

FIG. 1B is a top layout view of multiple solar cell substrates 120, in accordance with an embodiment of the present invention. The multiple solar cell substrates 120 are formed from a single substrate blank 122. The substrate blank 122 is substantially rectangular as opposing sides 124 and 126 are parallel and opposing sides 128 and 130 are parallel. Adjacent sides 124 and 128 and adjacent sides 126 and 130 are substantially perpendicular. The multiple trapezoidal shape solar cell substrates 120 can be formed from the substantially rectangular substrate blank 122 with minimal waste materials 122A.

Alternate shapes of the substrate 120 can include substantially square, rectangle, parallelogram and triangular shapes and any suitable shape that can be cut from the substrate blank 122 with minimal waste material 122A area of the substrate blank. By way of example, rectangle, parallelogram and triangular shaped substrates 120 can be cut from a substantially rectangular substrate blank 122 with substantially zero waste area 122A in some instances.

Alternate materials for the substrate 120 can include a metal or metal alloy, ceramic, resin, plastic, various types of glass or crystal, silicon substrate. The substrate 120 can include a conductive substrate. The substrate 120 can be a substantially flexible material (e.g. a plastic) or a substantially non-flexible material (e.g., glass, metal, etc.). The substrate 120 can include multiple layers not described in detail herein such as one or more conductive layers and one or more non-conductive layers. The substrate 120 can include electrical interconnects between the one or more conductive layers and through the one or more non-conductive layers. The substrate 120 can have any suitable thickness.

FIG. 1C is a 1C-1C cross-sectional view of the solar cell 100, in accordance with an embodiment of the present invention. It should be understood that FIG. 1C is not drawn to scale and the illustrated dimensions are exaggerated for the purposes of illustration and discussion. The solar cell 100 includes the substrate 120, a conductive layer 140, a copper, indium, gallium and selenium (CIGS) layer 150, a buffer layer 160, a transparent conductive layer 170, a conductive grid 176, an anti-reflective layer 180 and a transparent protective layer 174.

The solar cell 100 includes a bottom electrical contact 192A electrically connected to the conductive layer 140. The solar cell 100 includes a top electrical contact 196A electrically connected to the transparent conductive layer 170 and the conductive grid 176. The CIGS layer 150 is formed over the conductive layer 140. The CIGS layer 150 and forms a P-N junction with the conductive layer 140. The CIGS layer 150 includes an edge 150A that covers over a respective edge 140A of the conductive layer 140. The opposing edge is formed in a manner described in more detail below to form the bottom contact 192A.

The buffer layer 160 is formed over the CIGS layer 150. The buffer layer 160 includes an edge 160A that covers over a respective edge 150A of the CIGS layer 150. The opposing edge is formed in a manner described in more detail below to form the bottom contact 192A.

The transparent conductive layer 170 and the conductive grid 176 are formed over the buffer layer 160. The transparent conductive layer 170 includes an edge 196A that covers over a respective edge 160A of the buffer layer 160. The edge 196A of the transparent conductive layer 170 forms a top contact. The opposing edge is formed in a manner described in more detail below to form the bottom contact 192A.

Figure 2:
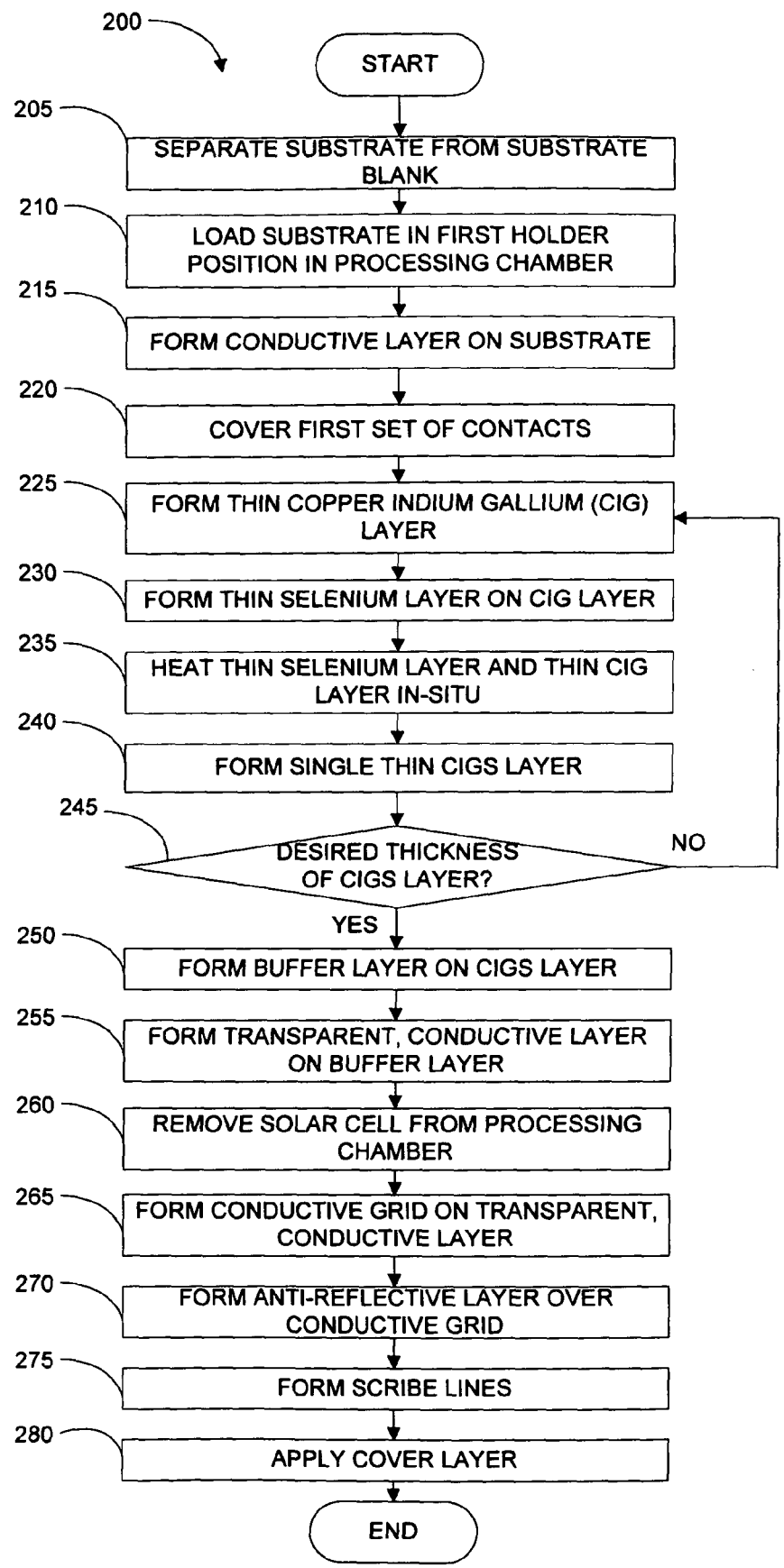
FIG. 2 is a flowchart diagram that illustrates the method operations performed in forming the solar cell, in accordance with one embodiment of the present invention.

FIG. 2 is a flowchart diagram that illustrates the method operations 200 performed in forming the solar cell 100, in accordance with one embodiment of the present invention. The operations illustrated herein are by way of example, as it should be understood that some operations may have sub-operations and in other instances, certain operations described herein may not be included in the illustrated operations. With this in mind, the method and operations 200 will now be described.

In an operation 205, the solar cell substrate 120 is separated from the substrate blank 122. The solar cell substrate 120 can be separated from the substrate blank 122 in any suitable manner (e.g., dicing, scoring, cutting, etc.) The separated solar cell substrate 120 can optionally be cleaned as may be required as part of the separation process.

Figure 1E:
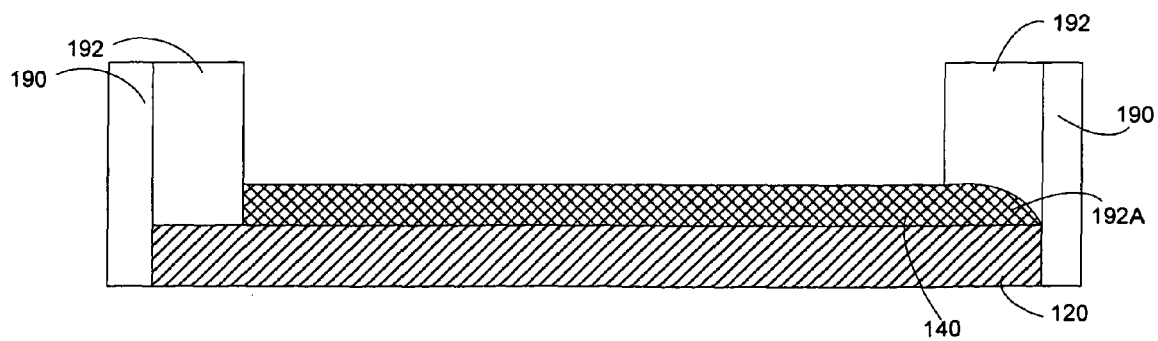
FIG. 1E is a cross-sectional view 1E-1E of the substrate in the first holder, in accordance with an embodiment of the present invention.

In an operation 210, the solar cell substrate 120 is loaded in a first holder 190. FIG. 1D is a simplified schematic diagram of the first holder 190, in accordance with an embodiment of the present invention. FIG. 1E is a cross-sectional view 1E-1E of the substrate 120 in the first holder 190, in accordance with an embodiment of the present invention. It should be understood that FIGS. 1D and 1E are not drawn to scale and the illustrated dimensions are exaggerated for the purposes of illustration and discussion. The first holder 190 includes a first set of contact fingers 192 that contact the surface of the substrate 120. The contact fingers 192 can be much smaller and fewer than shown. The contact fingers 192 need only hold the substrate and not cover the desired bottom contact locations 192A on the substrate 120.

In an operation 215, a first layer 140 is formed on the substrate 120. The first layer 140 is a reflective, conductive layer. The conductive layer 140 can be formed by sputtering material onto the substrate 120 or by any other suitable process for forming the conductive layer. The conductive layer 140 is formed on the exposed portions of the substrate 120 including the desired contact locations 192A. The conductive layer 140 can be a molybdenum or molybdenum containing material or other suitable conductive materials (e.g., copper, copper containing materials, transparent conductive oxide (TCO) (e.g., indium tantalum oxide (InTaO)).

The conductive layer 140 can have a thickness of between about 1 and abut 2 microns. The conductive layer 140 is formed in produce a minimum sheet resistance. The conductive layer 140 can be formed at a pressure of between about 100 mtorr and about 5 mtorr and more specifically at pressures between about 60 mtorr and about 7 mtorr and combinations thereof. By way of example, a first portion of the conductive layer 140 can be formed at a relatively high pressure (e.g., about 60 mtorr) and a second portion of the conductive layer 140 can be formed at a relatively low pressure (e.g., about 7 mtorr). Similarly, a first portion of the conductive layer 140 can be formed at a relatively high pressure (e.g., about 60 mtorr) and a remaining portion of the conductive layer 140 can be formed at a continuously falling pressure gradient over time (e.g., between about 5 minutes and about 20 minutes) and arriving at a final pressure of about 7 mtorr. The pressure gradient can be a substantially linear (i.e., constant slope) gradient or a progressive slope gradient or curve (e.g., increasing slope gradient or curve) or regressive slope gradient or curve (e.g., decreasing slope gradient or curve).

Figure 1F:
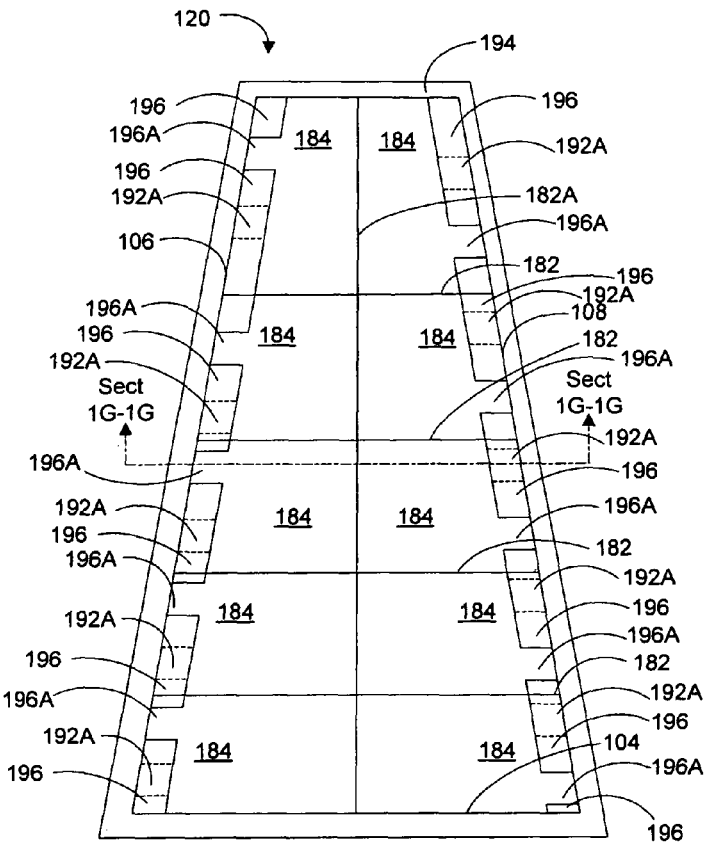
FIG. 1F is a simplified schematic diagram of the second holder, in accordance with an embodiment of the present invention.
Figure 1G:
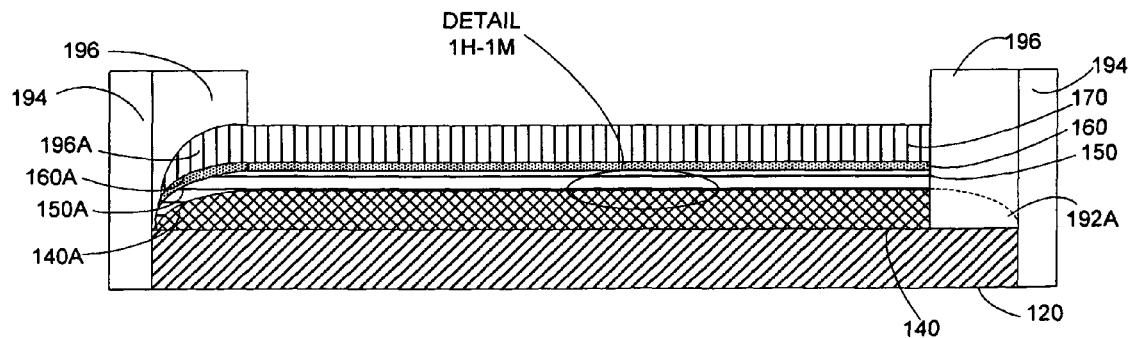
FIG. 1G is a cross-sectional view 1G-1G of the substrate in the second holder, in accordance with an embodiment of the present invention.

In an operation 220, the solar cell substrate 120 is loaded in a second holder 194. The second holder 194 includes a second set of contact fingers 196 that cover the surface of the substrate 120 at the contacts 192A on the first layer 140. The contact fingers 196 do not cover multiple desired locations for the top layer contacts 196A. FIG. 1F is a simplified schematic diagram of the second holder 194, in accordance with an embodiment of the present invention. FIG. 1G is a cross-sectional view 1G-1G of the substrate 120 in the second holder 194, in accordance with an embodiment of the present invention. FIGS. 1H-1M show a detailed view of the formation of the CIGS layer 150, in accordance with an embodiment of the present invention. It should be understood that FIGS. 1F-1M are not drawn to scale and the illustrated dimensions are exaggerated for the purposes of illustration and discussion. The top contact locations 196A are not the same as bottom contact locations 192A. The top contact locations 196A are offset from and physically separated from the bottom contact locations 192A. The foregoing formation of the contacts 192A, 196A during formation of the solar cell 100 eliminates a typically difficult and costly scribing (e.g., by laser or mechanical) process in the typical solar cell manufacturing processes.

Figure 1H:
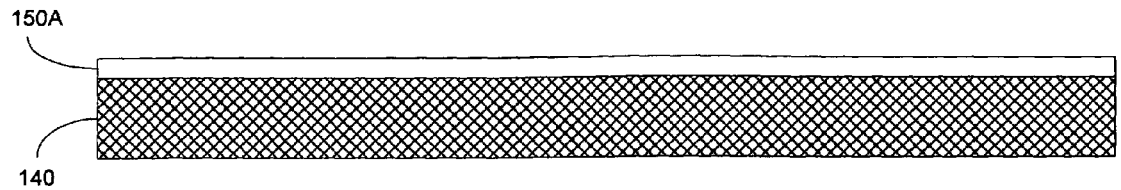

In an operation 225, a relatively thin (e.g., about 50-200 Angstroms thickness) copper indium gallium (CIG) layer 150A is formed on the conductive layer 140 as shown in FIG. 1H.

In an operation 230, and as shown in FIG. 1-i, a relatively thin (e.g., about 50-200 Angstroms thickness) selenium layer 150B is formed on the relatively thin CIG layer 150A. A selenium source material is heated to between about 200 degrees C. and about 350 degrees C. for between about 1 to about 15 minutes to cause the selenium to evaporate and form a layer of between about 50 and about 200 angstroms thick or thicker with more time and/or greater temperature.

Figure 1J:
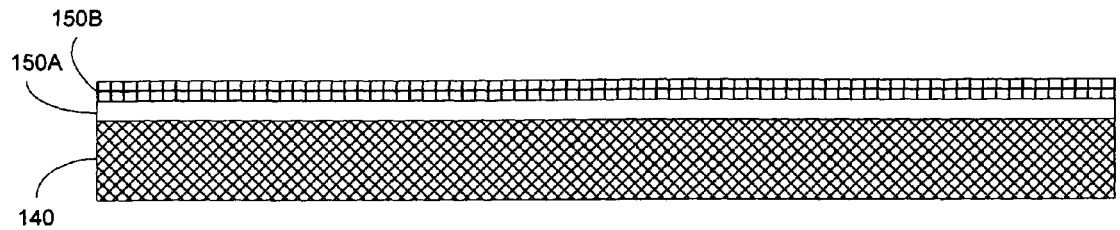
Figure 1J:
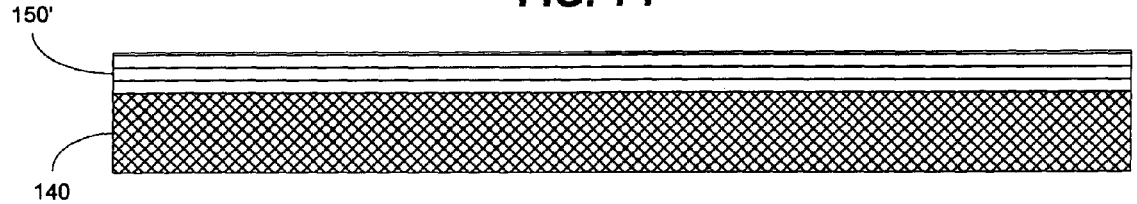

In an operation 235, and as shown in FIG. 1J, the relatively thin CIG layer 150A and the relatively thin selenium layer 150B are heated to between about 280 and about 550 degrees C. to form a relatively thin CIGS layer 150' in an operation 240.

Figure 1K:
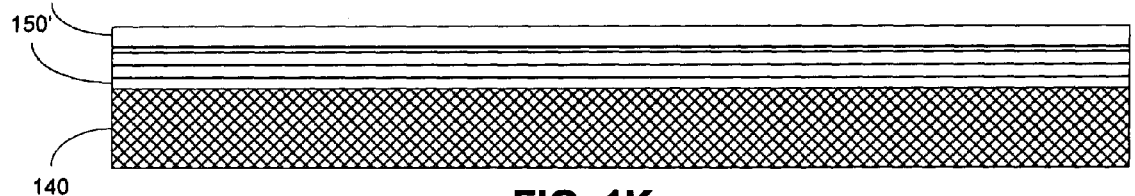
Figure 1L:
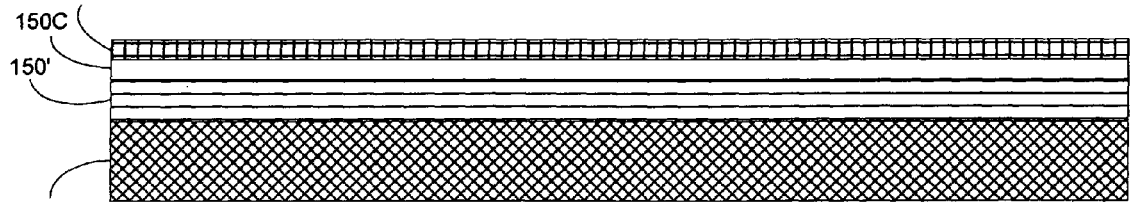
Figure 1M:
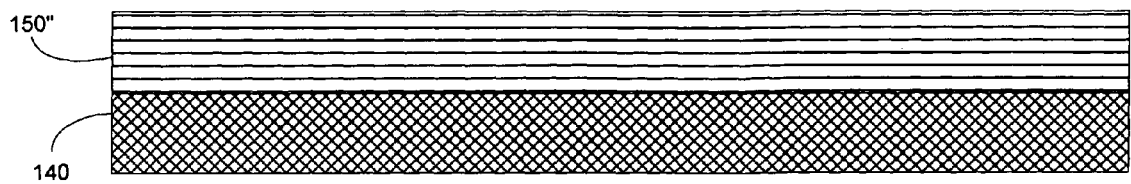

In an operation 240, and as shown in FIGS. 1K-1M, operations 225-240 are conducted iteratively to form additional relatively thin CIG layers 150C and additional relatively thin selenium layers 150D to build up a progressively thicker CIGS layer 150" until the CIGS layer 150 having a desired thickness (e.g., between less than about 1 to greater than about 2 micron) is formed. The CIGS layer 150 is formed in a ratio of one part copper, X parts indium, 1-X parts gallium and two parts selenium, where X is between about 0.0 and about 0.3. It should be understood that the formation of the CIGS layer from the previously applied CIG and selenium layers may require additional time and energy and thus a first, relatively thin CIGS layer may not fully form before subsequent CIG and selenium layers are formed. Thus, iterations of operations 225-240 may not occur in the order and timing presented.

The substrate 120 is heated to about 250 degrees C. before the first relatively thin CIG layer is formed. Each iterative heating of the CIGS layer heats the substrate 120 to between about 450 and about 550 degrees C. The CIGS layer 150 is formed at a pressure of between about 15 mtorr and about 5 mtorr. Forming multiple thin CIGS 150', 150" layers as described above provides a more efficient CIGS layer 150 in the photovoltaic operation.

Operations 225-245 can be in-situ in a single processing chamber. The single processing chamber can be a rotary processing chamber as described in more detail below. The single processing chamber can be vacuum-based (e.g., less than about $3 \times 10^{-7}$ torr) process including co-evaporating and/or co-sputtering copper, indium and gallium to form the thin CIG layer 150A, 150C followed by an evaporating and/or sputtering of a selenium containing material, followed by exposure to a heat source of sufficient intensity to anneal or substantially melt the thin CIG layer 150A, 150C and the thin selenium layer 150B, 150D into a single, thin CIGS layer 150', 150".

A single, rotary chamber can form the relatively thin CIG layer 150A, 150C and the relatively thin selenium layer 150B, 150D and apply the heat in different segments of the chamber as the substrate 120 revolves around the chamber. The rotary chamber can rotate substrate 120 at a rate of between about 1 and about 100 revolutions per minute. The revolution rate and the operating pressures and concentrations of the materials determine the thickness of the relatively thin CIG layer 150A, 150C and the relatively thin selenium layer 150B, 150D on the substrate 120 formed in each revolution.

Each revolution can form one of either the relatively thin CIG layer 150A, 150C and the relatively thin selenium layer 150B, 150D on the substrate 120. Alternatively, each revolution can form one of each of the relatively thin CIG layer 150A, 150C and the relatively thin selenium layer 150B, 150D on the substrate 120 and also heat the relatively thin CIG layer 150A, 150C and the relatively thin selenium layer 150B, 150D to form the thin CIGS layer 150', 150". In a rotary chamber of sufficient size multiple relatively thin CIG 150A, 150C and relatively thin selenium layers 150B, 150D can be formed in each revolution.

Iteratively forming the CIGS layer 150 from about 100 or more (e.g., about 100 to about 500), relatively thin CIGS layers 150', 150", creates a more efficient CIGS layer 150 as the selenium is more fully integrated into the lattice of the copper, indium and gallium than the selenium can integrate into a single, thicker CIG layer. Iteratively forming the CIGS layer 150 from about 100 or more, thinner CIGS layers 150', 150", creates the CIGS layer 150 using between about 10% and about 50% of the energy required to form a typical CIGS layer.

In an operation 250, a buffer layer 160 is formed on the CIGS layer 150. The buffer layer 160 includes a zinc sulfide and/or a zinc selenium or similar materials and combinations thereof. The zinc can be sputtered on the CIGS layer 150 and the selenium can be evaporated onto the zinc. The buffer layer 160 requires about 1 to about 15 minutes to cause the selenium to evaporate and form a layer of less than about 1000 angstrom, although a thicker layer could be formed but is not necessary.

A zinc sulfide layer can be formed by sputtering the zinc in a reactive gas including sulfur (e.g., hydrogen sulfide). The hydrogen zinc and sulfur are separated as radicals in the sputtering plasma and the zinc and sulfur combine on the surface of the target (e.g., the CIGS layer 150) to form a zinc sulfide layer. The hydrogen is released.

The thickness of the buffer layer 160 is determined by the process time and/or greater temperature. The buffer layer 160 provides band matching for the desired wavelengths of light.

The contact fingers 196 mask locations 192A and expose locations 196A during operations 225-250. Thus, the contact fingers 196 prevent the CIGS layer 150 from forming in the locations 192A. As a result, the locations 192A can be used as bottom electrical contacts to the conductive layer 140.

In an operation 255, a transparent conductive layer 170 is formed on the buffer layer 160. The transparent conductive layer 170 is substantially transparent to the desired wavelengths of light. The transparent conductive layer 170 can include zinc oxide doped with a conductor such as aluminum. The transparent conductive layer 170 collects the electrical energy from the CIGS layer 150.

In an operation 260, the solar cell 100 is removed from the processing chamber. The conductive grid 176 is formed on the transparent conductive layer 170 in an operation 265. The conductive grid 176 improves the efficiency of collecting the electrical energy from the CIGS layer 150 by providing a lower resistance electrical path across the transparent conductive layer 170 to the top electrical contact 196A. The conductive grid 176 has line widths limited to only a few micron.

In an operation 270, an anti-reflective layer 180 is formed on the conductive grid 176 and the transparent conductive layer 170. The anti-reflective layer 180 is substantially anti-reflective to minimize the amount of light that is reflected from the solar cell 100. The anti-reflective layer 180 can be a magnesium fluoride, silicon nitride or any suitable material having a sufficiently high index of refraction (e.g., between about 3 and about 5). The anti-reflective layer 180 has a thickness of between less than about 1000 angstroms and about 4000 angstroms. The anti-reflective layer 180 can be formed from in any suitable manner (e.g., spin on or dipped liquid or other suitable depositing methods. Multi-layer anti-reflective layers as are well known in the art can also be used.

In an operation 275, scribe lines 182 are formed through the anti-reflective layer 180, conductive grid 176, the transparent conductive layer 170, the buffer layer 160, the CIGS layer 150, the conductive layer 140 and into, but not fully through, the substrate 120. The scribe lines 182 divide the substrate 120 into multiple, smaller solar cells or zones 184. Each of the smaller solar cells 184 can have a substantially equal area. The scribe lines 182 physically sever electrical connections between the smaller solar cells 184.

It should be understood that the scribe lines 182 can be applied before the anti-reflective layer 180. The scribe lines 182 can optionally be filled with an electrically insulating material. The electrically insulating material in the scribe lines 182 can be substantially transparent. By way of example, the anti-reflective layer 180 can fill the scribe lines 182. It should be understood that for description purposes, the material stack shown in FIG. 1C is not drawn to scale and the layer 140-180 have a totally thickness of between about 3 micron to about 5 micron and thus the scribe lines 182 are very small in depth (e.g., only slightly deeper than about 3 micron to about 5 micron).

In an operation 280, an optional encapsulation or cover layer 174 is formed over the scribe lines 182. The cover layer 174 can include conductive traces 175 that connect the multiple smaller solar cells 184 in a desired electrical fashion (e.g., series, parallel or combinations thereof). The optional cover layer 174 can be formed similarly to the anti-reflective layer or even a solid plate glass or similar substantially transparent materials.

The method operations can continue in operation 210 above for processing additional substrates 120. Alternatively, the method operations can end if there are no additional substrates 120 to process.

Figure 3:
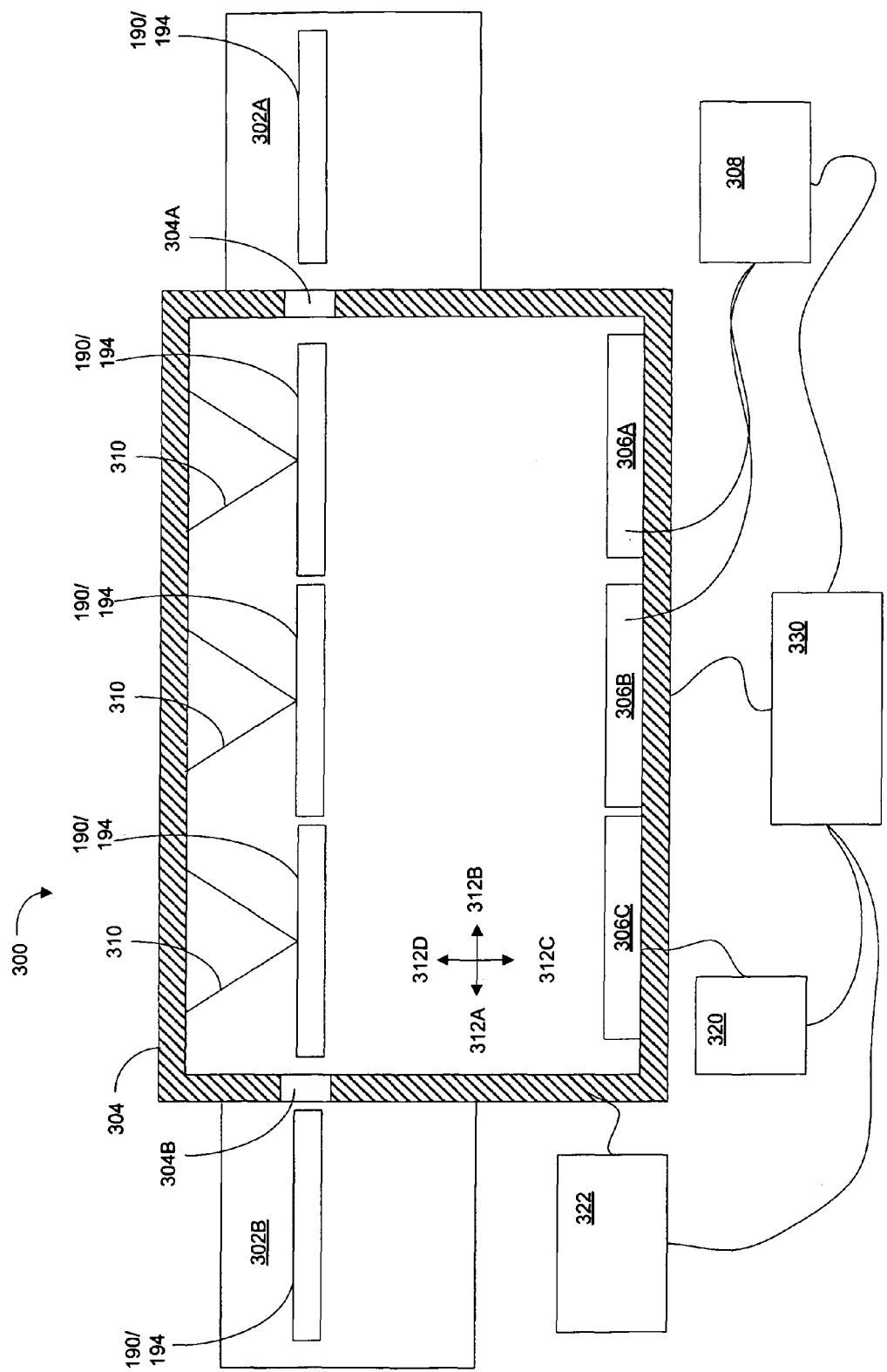
FIG. 3 is a simplified schematic of a processing chamber system, in accordance with one embodiment of the present invention.

FIG. 3 is a simplified schematic of a processing chamber system 300, in accordance with one embodiment of the present invention. The processing chamber system 300 includes processing chamber 304, load locks 302A, 302B, load ports 304A, 304B. The processing chamber system 300 is coupled to a power source 308, a substrate support system 310, a pressure control system 320, a process gas source 322 and a controller 330. The controller 330 controls the processing chamber system 300. The controller 330 includes software, hardware, operating systems, and recipes to control the processing chamber system 300.

The processing chamber 304 includes multiple process sources 306A, 306B and 306C. One or more holders 190, 194 can carry corresponding substrates 120 through the processing chamber 304. The substrate support system 310 can move the one or more holders 190, 194 in directions 312A-312D near, over and past the multiple process sources 306A, 306B and 306C for processing. By way of example, each of the process sources 306A, 306B and 306C can conduct a different process. In one exemplary embodiment, process source 306A can apply the relatively thin CIG layer and process source 306B can apply the relatively thin selenium layer, and process source 306C can be a heat source to heat the relatively thin. CIG layer and the relatively thin selenium layer to form one relatively thin CIGS layer. The one or more holders 190, 194 can be moved in directions 312A-312D for iterative processing such as to produce multiple, relatively thin CIGS layers to form the CIGS layer 150 of the desired thickness.

Figure 4:
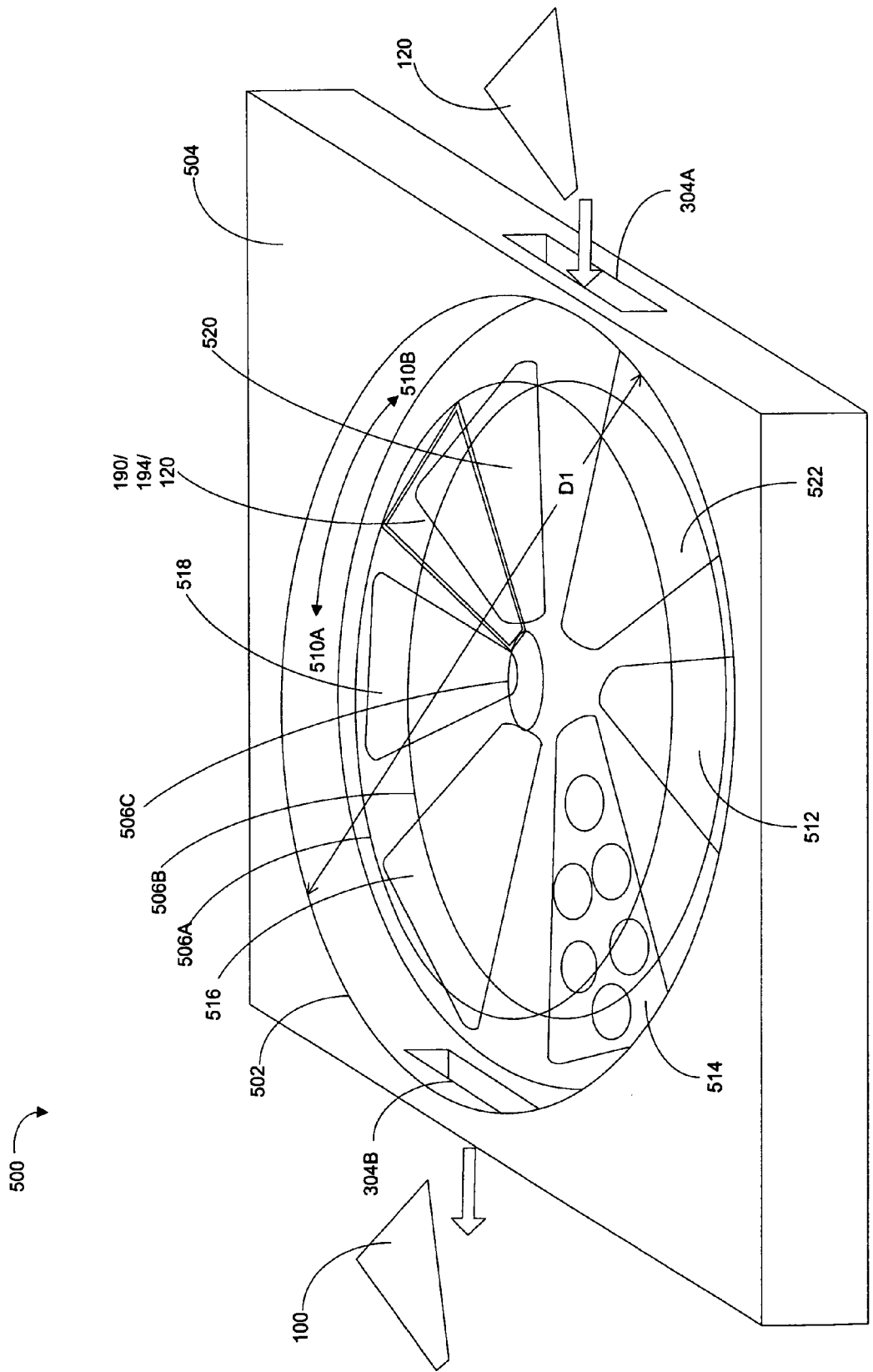
FIG. 4 is a simplified schematic of a rotary processing chamber, in accordance with one embodiment of the present invention.
Figure 5:
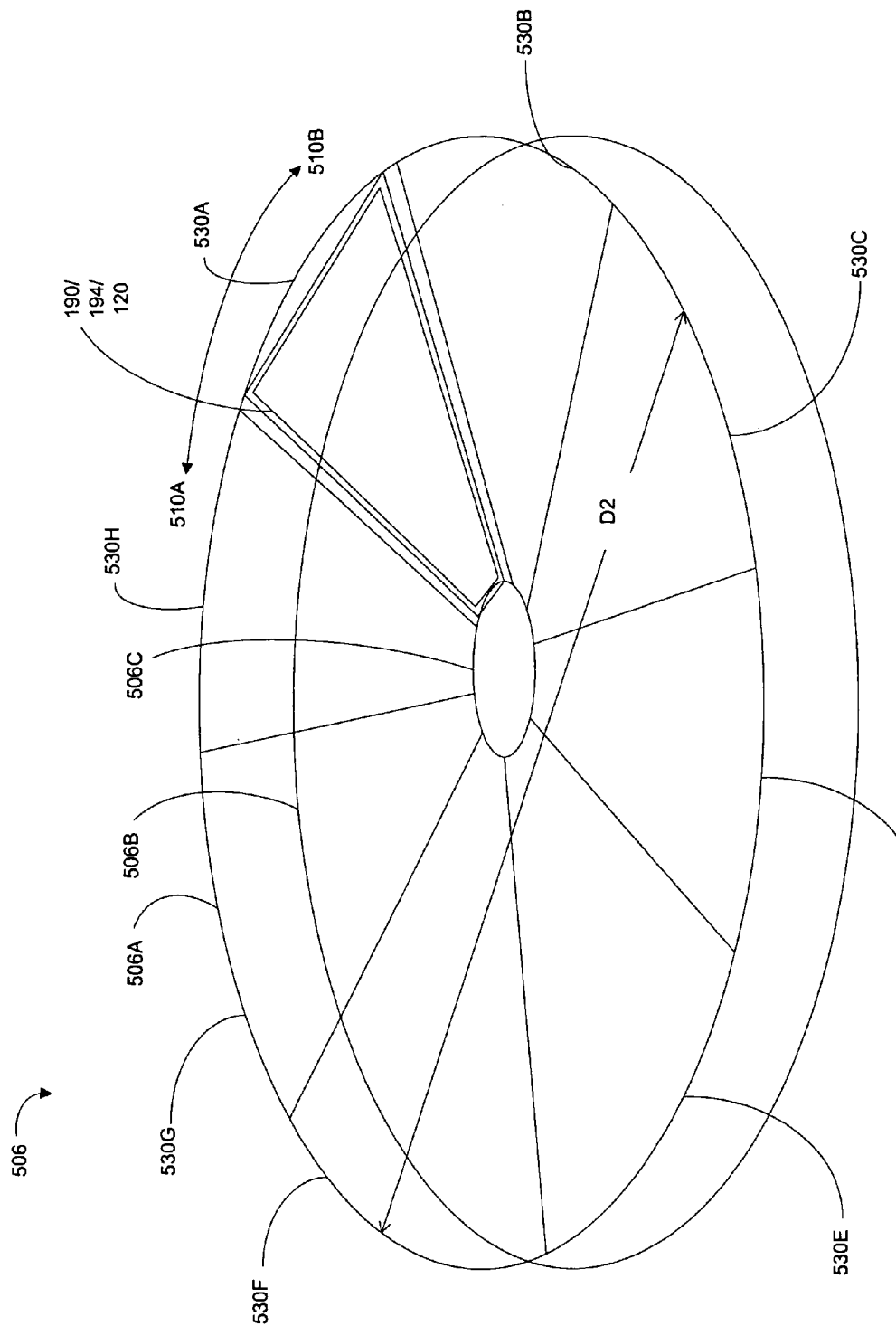
FIG. 5 is a simplified schematic of a rotary support, in accordance with one embodiment of the present invention.

FIG. 4 is a simplified schematic of a rotary processing chamber 500, in accordance with one embodiment of the present invention. FIG. 5 is a simplified schematic of a rotary support 506, in accordance with one embodiment of the present invention. The rotary processing chamber 500 includes multiple processing positions 512, 514, 516, 518, 520. The rotary processing chamber 500 includes a rotary support 506A.

The rotary processing chamber 500 has a diameter D1 suitable for supporting multiple holders 190 and 194. By way of example the diameter D1 can be between about 500 to about 1000 mm. By way of example, if the substrate 120 has a length L3 of about 200 mm, the diameter D1 can be about 500 mm. Similarly, if the substrate 120 has a length L3 of about 400 mm, the diameter D1 can be about 900 mm. Similarly, the rotary support 506A has a corresponding diameter D2 suitable for supporting one or more holders 190 and 194. The rotary substrate support 506A and transport system 506 can support and/or rotating a substrate having a largest dimension of between about 400 mm and about 900 mm. A motor is also coupled to the rotary substrate support 506A so the motor can rotate the rotary substrate support.

The rotary substrate support 506A includes multiple holder positions 530A-530H. Each of the holder positions 530A-530H can hold one of the holders 190, 194. The holders 190, 194 can be part of the rotary support 506A. The rotary substrate support 506A is coupled to a motor capable of rotating the rotary support in directions 510A, 510B at revolution rates of between about 0.1 to about 100 revolutions per minute. The rotary substrate support 506A can also be stopped at different locations in the revolution.

By way of example, the processing position 512 can form the reflective, conductive layer 140 of the substrate 120. Processing position 514 can form the relatively thin CIG layer while processing position 516 forms the relatively thin selenium layer on the relatively thin CIG layer, while processing position 518 heats the relatively thin CIG and relatively thin selenium layer to form a relatively thin CIGS layer. Rotating one or more substrates 120 past processing positions 514, 516, 518 can iteratively build up the CIGS layer 150 as described above.

Once the CIGS layer 150 of the desired thickness if formed, processing position 520 can form the buffer layer 160 on the CIGS layer 150. The transparent conductive layer 170 can be formed on the buffer layer 160 by processing position 522. As the rotary substrate support 506A passes the substrates over the processing positions 512-522 at the desired revolution rate and the desired number of revolutions, the corresponding layers can be formed to the corresponding desired thicknesses.

It should be understood that the processing positions can be shaped and sized similar to the substrate 120 or entirely unrelated shapes. By way of example, the processing positions 512-522 can be substantially rectangular while the substrate is substantially trapezoidal or even triangular. Similarly, the area of the processing positions 512-522 substantially similar to the area of the substrate 120 or completely unrelated such that the processing positions 512-522 substantially greater or lesser area as compared to the area of the substrate 120.

In some embodiments the more or less processing positions 512-522 (e.g., zero to twenty) can be included in the processing chamber 500, as may be desired for the particular processes included in the process chamber. Additional features not shown can also be included in the processing chamber 500. By way of example, the processing chamber 500 can include optical windows, in-situ measuring sensors. While not shown, it should be understood the process chamber 500 includes a cover or lid to enclose the processing chamber.

Figure 6A:
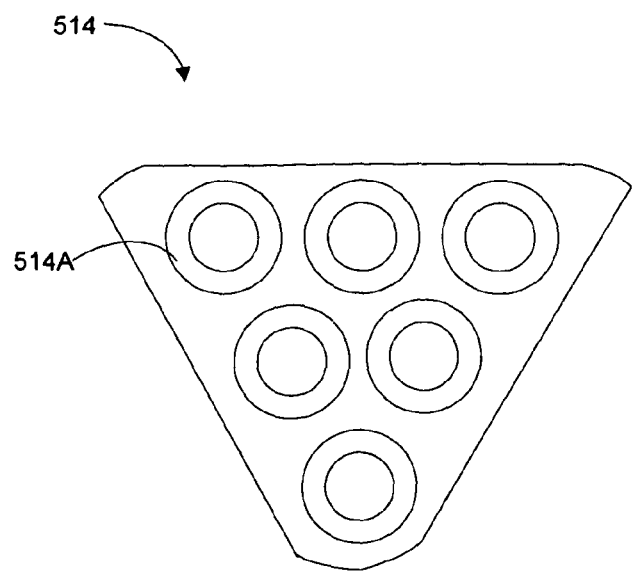
FIG. 6A is a simplified schematic diagram of the plasma source, in accordance with an embodiment of the present invention.

FIG. 6A is a simplified schematic diagram of the processing source 514, in accordance with an embodiment of the present invention. The processing source 514 can be a plasma source 514. The plasma source 514 can form multiple plasma rings 514A within an area substantially similar in shape to the substrate 120. By way of example, if the substrate 120 is trapezoid in shape, then the plasma source 514 is also trapezoidal in shape. The plasma source 514 can have an area of between about 90% and 150% of the area of the substrate 120.

One or more plasma rings 514A can be formed by desired arrangement of magnets in the plasma source 514. The number, arrangement and size of the multiple plasma rings 514A can be selected as desired to form the desired plasma field density to substantially evenly cover the area of the substrate 120. The plasma field is not required to have 100% uniform density as the substrate is passed over the plasma source 514 during plasma processing. The uniformity of the plasma operation on the substrate 120 is determined by the residence time, the number of revolutions, the density of the plasma field and several other factors that are selectable and controllable as desired.

Figure 6B:
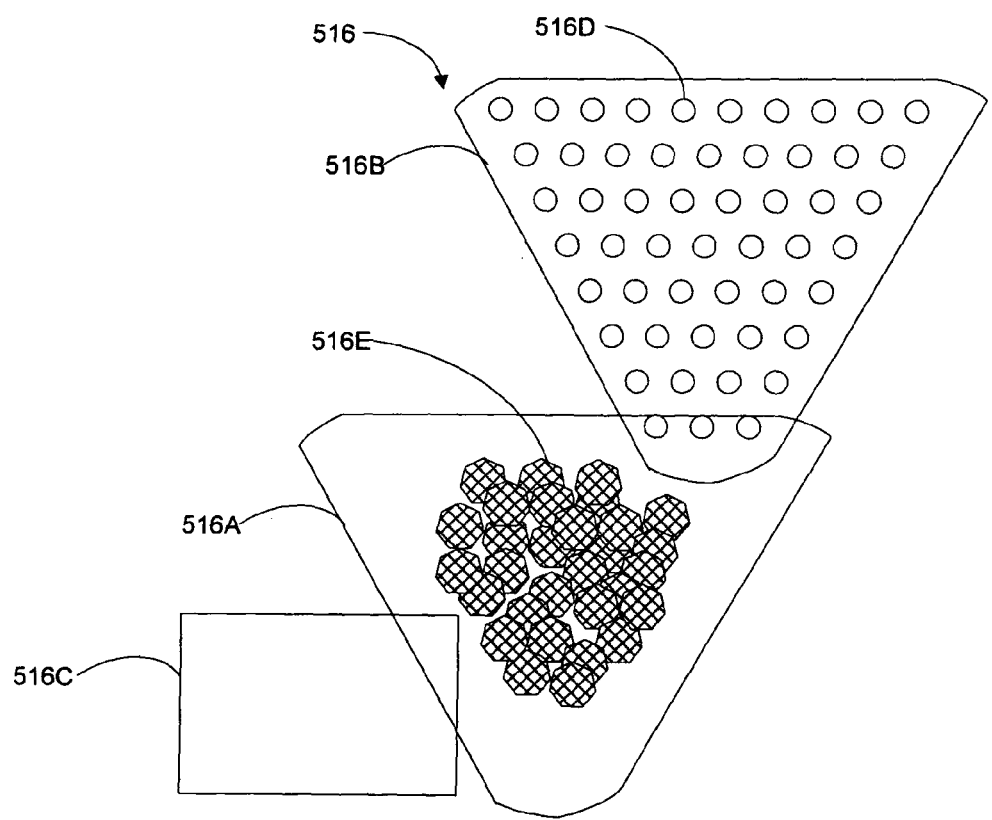
FIG. 6B is a simplified schematic diagram of the selenium evaporator, in accordance with an embodiment of the present invention.

FIG. 6B is a simplified schematic diagram of the processing source 516, in accordance with an embodiment of the present invention. The processing source 516 can include a selenium evaporator 516. The selenium evaporator 516 includes a tray 516A, a cover 516B, a heat source 516C. The tray 516A is shaped to correspond to the substrate 120. By way of example, if the substrate 120 is trapezoid in shape, then the tray 516A is also corresponding trapezoidal shape.

The cover 516B has an area of between about 90% and 150% of the area of the substrate 120. The cover 516B includes multiple holes 516D. The holes 516D can be between about 0.1 and about 1 mm in diameter. The holes 516D can be larger or smaller. The distribution density (e.g., spacing) of holes 516D in the cover 516B vary with the width of the cover so that a substantially uniform density selenium vapor is emitted along the entire area of the cover.

In operation, a selenium source material 516E (e.g., granular selenium and selenium containing material) is placed in the tray 516A. The heat source 516C heats the tray 516A and the selenium source material therein until the selenium evaporates. The heat source 516C heats the selenium source material 516E to between about 200 to about 350 degrees C. and more specifically to between about 270 degrees C. and about 320 degrees C. The evaporated selenium is emitted through the multiple holes 516D in the cover 516B. The evaporated selenium condenses on the substrate 120 as the substrate passes above the cover 516B.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 7:
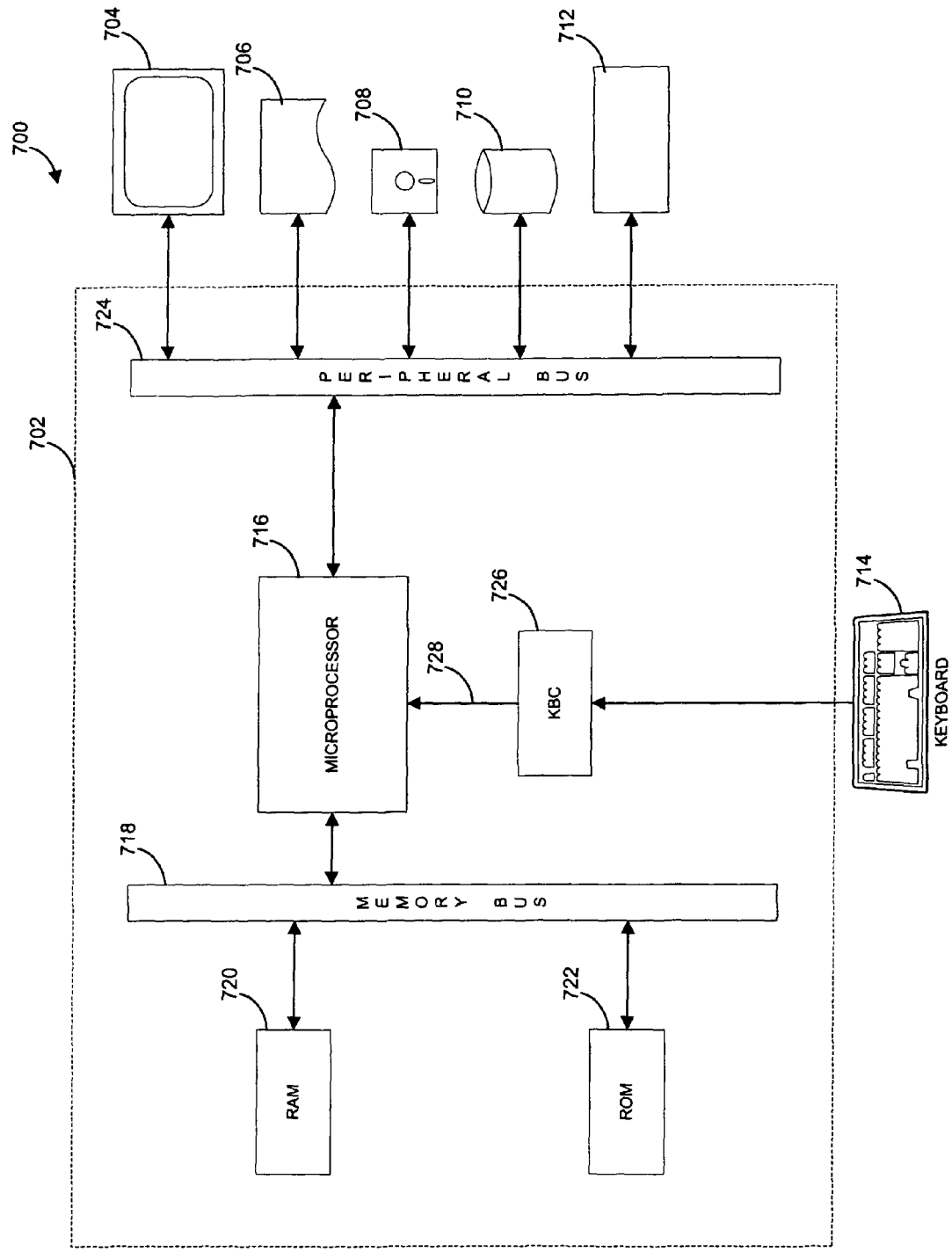
FIG. 7 is a block diagram of an exemplary computer system for carrying out the processing according to the invention.

FIG. 7 is a block diagram of an exemplary computer system 700 for carrying out the processing according to the invention. The computer system 700 can be coupled to the processing chamber 300, 500 to control the operations of the processing chamber (e.g., controller 330). The computer system 700 includes a digital computer 702, a display screen (or monitor) 704, a printer 706, a floppy disk drive 708, a hard disk drive 710, a network interface 712, and a keyboard 714. The digital computer 702 includes a microprocessor 716, a memory bus 718, random access memory (RAM) 720, read only memory (ROM) 722, a peripheral bus 724, and a keyboard controller (KBC) 726. The digital computer 702 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 716 is a general purpose digital processor, which controls the operation of the computer system 700. The microprocessor 716 can be a single-chip processor or can be implemented with multiple components. Using instructions retrieved from memory, the microprocessor 716 controls the reception and manipulation of input data and the output and display of data on output devices.

The memory bus 718 is used by the microprocessor 716 to access the RAM 720 and the ROM 722. The RAM 720 is used by the microprocessor 716 as a general storage area and as scratch-pad memory, and can also be used to store input data and processed data. The ROM 722 can be used to store instructions or program code followed by the microprocessor 716 as well as other data.

The peripheral bus 724 is used to access the input, output, and storage devices used by the digital computer 702. In the described embodiment, these devices include the display screen 704, the printer device 706, the floppy disk drive 708, the hard disk drive 710, and the network interface 712. The keyboard controller 726 is used to receive input from keyboard 714 and send decoded symbols for each pressed key to microprocessor 716 over bus 728.

The display screen 704 is an output device that displays images of data provided by the microprocessor 716 via the peripheral bus 724 or provided by other components in the computer system 700. The printer device 706, when operating as a printer, provides an image on a sheet of paper or a similar surface. Other output devices such as a plotter, typesetter, etc. can be used in place of, or in addition to, the printer device 706.

The floppy disk drive 708 and the hard disk drive 710 can be used to store various types of data. The floppy disk drive 708 facilitates transporting such data to other computer systems, and hard disk drive 710 permits fast access to large amounts of stored data.

The microprocessor 716 together with an operating system operate to execute computer code and produce and use data. The computer code and data may reside on the RAM 720, the ROM 722, or the hard disk drive 710. The computer code and data could also reside on a removable program medium and loaded or installed onto the computer system 700 when needed. Removable program media include, for example, CD-ROM, PC-CARD, floppy disk, flash memory, optical media and magnetic tape.

The network interface 712 is used to send and receive data over a network connected to other computer systems. An interface card or similar device and appropriate software implemented by the microprocessor 716 can be used to connect the computer system 700 to an existing network and transfer data according to standard protocols.

The keyboard 714 is used by a user to input commands and other instructions to the computer system 700. Other types of user input devices can also be used in conjunction with the present invention. For example, pointing devices such as a computer mouse, a track ball, a stylus, or a tablet can be used to manipulate a pointer on a screen of a general-purpose computer.

Figure 8:
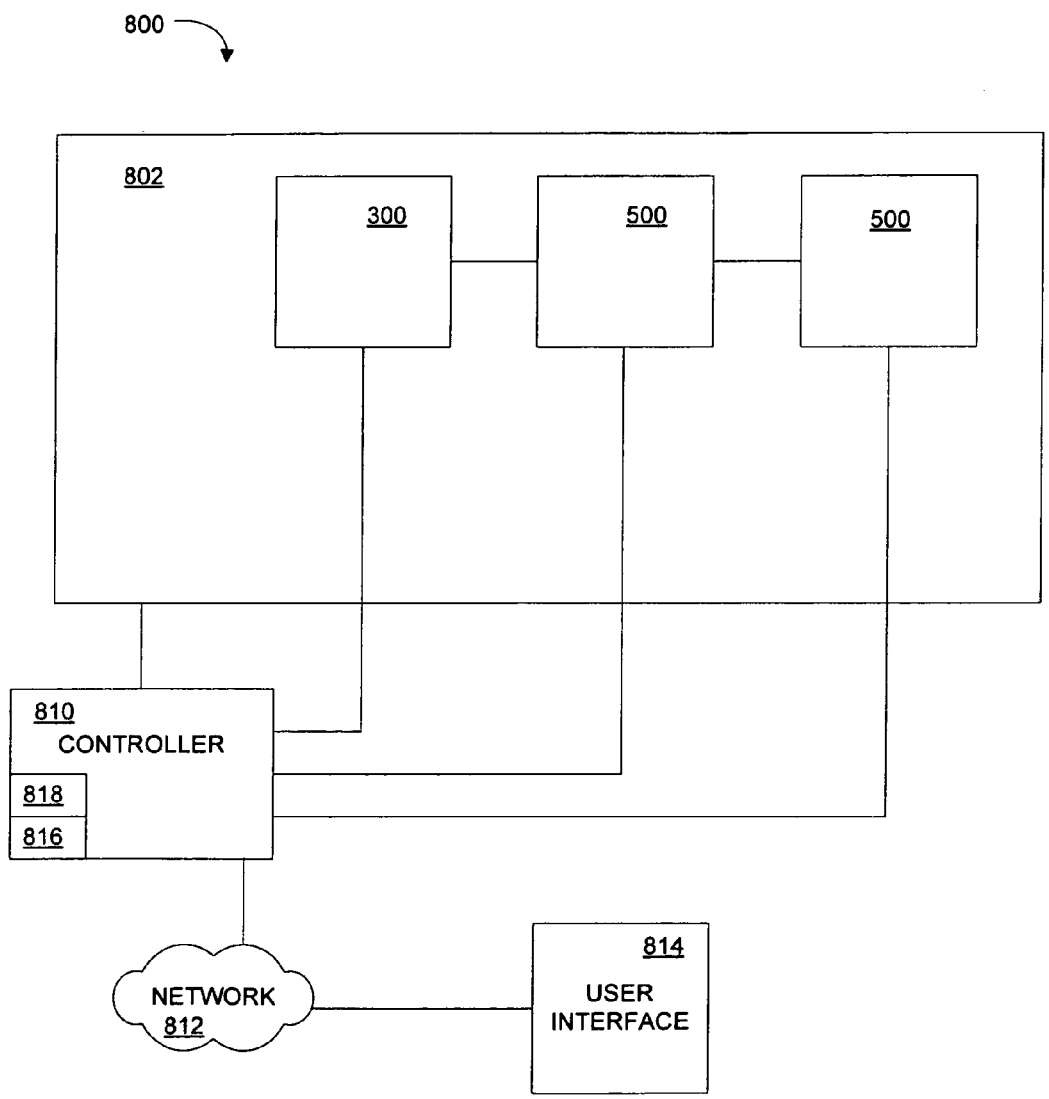
FIG. 8 is a block diagram of an integrated system 800 including one or more of the process chambers, in accordance with an embodiment of the present invention.

FIG. 8 is a block diagram of an integrated system 800 including one or more of the process chambers 300, 500, in accordance with an embodiment of the present invention. The integrated system 800 includes the one or more of the process chambers 300, 500 and an integrated system controller 810 coupled to the process chamber(s). The integrated system controller 810 includes or is coupled to (e.g., via a wired or wireless network 812) a user interface 814. The user interface 814 provides user readable outputs and indications and can receive user inputs and provides user access to the integrated system controller 810.

The integrated system controller 810 can include a special purpose computer or a general purpose computer. The integrated system controller 810 can execute computer programs and/or logic 816 to monitor, control and collect and store data 818 (e.g., performance history, analysis of performance or defects, operator logs, and history, etc.) for the chamber(s) 300, 500. By way of example, the integrated system controller 810 can adjust the operations of the chambers 300, 500 and/or the components therein (e.g., the temperatures, flow rates, pressures, locations, movement, loading and unloading of the substrate 100, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. That transformed data can be saved to storage and then manipulated by a processor. The processor thus transforms the data from one thing to another. Still further, the methods can be processed by one or more machines or processors that can be connected over a network. Each machine can transform data from one state to another and can also process data, save data to storage, transmit data over a network, display the result or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming multiple layers in a single process chamber comprising:
    placing a substrate in a first holder in the single process chamber having a plurality of processing sources, the first holder includes a first plurality of contact fingers;
    forming a conductive layer on the substrate in the process chamber, wherein the first plurality of contact fingers contacting the substrate in locations other than a plurality of bottom layer contact locations and wherein forming the conductive layer on the substrate includes forming the conductive layer in the plurality of bottom layer contact locations; and
    forming a copper indium gallium selenium (CIGS) layer including iteratively forming a plurality of thin CIGS layers, each one of the thin CIGS layers has a thickness of between 100 and 400 Angstroms, wherein forming each one of the thin CIGS layers including:
        forming a thin copper indium gallium (CIG) layer on the substrate including passing the substrate over at least one CIG source in the single processing chamber, the formed, thin CIG layer having a thickness of between 50 Angstroms and 200 Angstroms;
        forming a thin selenium layer on the formed, thin CIG layer including passing the substrate over at least one selenium evaporator source in the single processing chamber, the formed, thin selenium layer having a thickness of between 50 Angstroms and 200 Angstroms; and
        heating the substrate, the formed, thin CIG layer and the formed, thin selenium layer including passing the substrate over at least one heat source in the single processing chamber, wherein the substrate passes over the at least one CIG source, the at least one selenium evaporator source and the at least one heat source at a rate of between 1 times per minute and 100 times per minute.

2. The method of claim 1, wherein the plurality of thin CIGS layers includes between 100 and 500 thin CIGS layers.

3. The method of claim 1, wherein at least a portion of the conductive layer is formed as a process chamber pressure is reduced from a first pressure between 60 mtorr and 100 mtorr to a second pressure between 5 mtorr and 7 mtorr wherein the process chamber pressure is reduced over a time of between 5 minutes and 20 minutes.

4. The method of claim 3, wherein the process chamber pressure is reduced over the time of between 5 minutes and 20 minutes at an increasing slope.

5. The method of claim 3, wherein the process chamber pressure is reduced over the time of between 5 minutes and 20 minutes at a decreasing slope.

6. The method of claim 1, further comprising forming a plurality of top layer contacts including:
    covering the plurality of bottom layer contacts and not covering a plurality of top layer contact locations with a second holder having a second plurality of contact fingers, the second plurality of contact fingers covering the plurality of bottom layer contacts and not covering a plurality of top layer contact locations; and
    wherein forming the CIGS layer includes forming the CIGS layer in the plurality of top layer contact locations.

7. The method of claim 1, further comprising:
    forming a buffer layer on the CIGS layer;
    forming a transparent conductive layer on the buffer layer;
    forming a conductive grid over the transparent conductive layer, the conductive grid extending over a plurality of top layer contacts; and
    forming a plurality of scribe lines to divide the substrate into a plurality of smaller cells.

8. The method of claim 7, wherein each of the smaller cells in the plurality of smaller cells have a substantially equal area.

9. The method of claim 1, wherein heating the substrate, the formed, thin CIG layer and the formed, thin selenium layer includes heating the substrate, the formed, thin CIG layer and the formed, thin selenium layer from an initial temperature of about 250 degrees C. to a final temperature of between about 450 degrees C. and about 550 degrees C.

10. The method of claim 1, wherein heating the substrate, the formed, thin CIG layer and the formed, thin selenium layer includes heating the substrate, the formed, thin CIG layer and the formed, thin selenium layer from an initial temperature of about 250 degrees C. to a final temperature of between about 450 degrees C. and about 550 degrees C., wherein the temperature of the substrate, the formed, thin CIG layer and the formed, thin selenium layer increases each iteration of forming each of the plurality of thin CIGS layers.

11. The method of claim 1, wherein the single process chamber includes a rotary support and wherein iteratively forming the plurality of thin CIGS layers includes rotating the substrate over the plurality of processing sources.

12. The method of claim 11, wherein rotating the substrate over the plurality of processing sources includes rotating the substrate over the plurality of processing sources at a revolution rate of between about 0.1 and about 100 revolutions per minute.

13. The method of claim 11, wherein the process chamber includes:
    a substrate support and transport system capable of moving a substrate contained therein over the plurality of processing sources, the substrate support system including:

a first holder including a first plurality of contact fingers, the first plurality of contact fingers contacting the substrate in locations other than a plurality of bottom layer contact locations; and a second holder having a second plurality of contact fingers, the second plurality of contact fingers covering the plurality of bottom layer contacts and not covering a plurality of top layer contact locations.

14. The method of claim 13, wherein the substrate support and transport system is capable of supporting and transporting a substrate having a largest dimension of between about 100 mm and about 900 mm.

15. The method of claim 13, wherein the process chamber includes a motor coupled to the substrate support and transport system.

16. The method of claim 11, wherein the process chamber includes a controller coupled to the process chamber, the controller including logic for controlling a plurality of operations in the process chamber.

17. The method of claim 11, wherein at least one processing source of the plurality of processing sources includes an evaporator, the evaporator including an evaporator tray, an evaporator cover having a plurality of holes and a heat source thermally coupled to the evaporator tray.

18. The method of claim 11, wherein at least one of the plurality of processing sources includes a plasma source, the plasma source including at least one ring plasma source.

19. The method of claim 11, wherein the processing chamber has a width of between about 200 mm and about 1000 mm.

20. A method for forming multiple layers in a single process chamber comprising:

placing a substrate in a first holder in the single process chamber having a plurality of processing sources, the first holder includes a first plurality of contact fingers;

forming a conductive layer on the substrate in the single process chamber, wherein at least a portion of the conductive layer is formed as the single process chamber pressure is reduced from a first pressure between 60 mtorr and 100 mtorr to a second pressure between 5 mtorr and 7 mtorr over a selected time interval; and forming a copper indium gallium selenium (CIGS) layer including iteratively forming a plurality of thin CIGS layers, each one of the thin CIGS layers has a thickness of between 50 and 200 Angstroms, wherein forming each one of the thin CIGS layers includes passing the substrate passes over at least one CIG source, at least one selenium evaporator source and at least one heat source at a rate of between 1 times per minute and 100 times per minute.

* * * * *